United States Patent
Evans, V et al.

(10) Patent No.: US 9,896,777 B2
(45) Date of Patent: Feb. 20, 2018

(54) METHODS OF MANUFACTURING STRUCTURES HAVING CONCEALED COMPONENTS

(71) Applicant: Essential Products, Inc., Palo Alto, CA (US)

(72) Inventors: David John Evans, V, Palo Alto, CA (US); Xinrui Jiang, San Jose, CA (US); Andrew E. Rubin, Los Altos, CA (US); Matthew Hershenson, Los Altos, CA (US); Xiaoyu Miao, Palo Alto, CA (US); Joseph Anthony Tate, San Jose, CA (US); Jason Sean Gagne-Keats, Cupertino, CA (US); Rebecca Schultz Zavin, Portola Valley, CA (US)

(73) Assignee: ESSENTIAL PRODUCTS, INC., Palo Alto, CA (US)

( * ) Notice: Subject to any disclaimer, the term of this patent is extended or adjusted under 35 U.S.C. 154(b) by 0 days.

(21) Appl. No.: 15/336,701

(22) Filed: Oct. 27, 2016

(65) Prior Publication Data
US 2017/0121840 A1    May 4, 2017

Related U.S. Application Data

(60) Provisional application No. 62/336,513, filed on May 13, 2016, provisional application No. 62/317,466, (Continued)

(51) Int. Cl.
*C25D 11/26* (2006.01)
*B32B 7/12* (2006.01)
(Continued)

(52) U.S. Cl.
CPC ................ *C25D 11/26* (2013.01); *B32B 7/12* (2013.01); *B32B 15/00* (2013.01); *B32B 18/00* (2013.01);
(Continued)

(58) Field of Classification Search
CPC ...... C25D 11/02; C25D 11/022; C25D 11/026; C25D 11/04; C25D 11/26; B32B 18/00;
(Continued)

(56) References Cited

U.S. PATENT DOCUMENTS 5,118,567 A    6/1992    Komiyama et al.
5,456,779 A    10/1995   Sinha et al.
(Continued)

FOREIGN PATENT DOCUMENTS

CN    1788385 B     6/2011
TW    200620543 A   6/2006
(Continued)

OTHER PUBLICATIONS

International Search Report and Written Opinion in PCT/US16/59519 dated Mar. 31, 2017, 11 pages.
(Continued)

*Primary Examiner* — Jiong-Ping Lu
(74) *Attorney, Agent, or Firm* — Perkins Coie LLP

(57) ABSTRACT

The disclosed embodiments include a method of integrating metal elements separated by gaps with a structure that conceals the metal elements and gaps. The method includes treating a metal substrate to a plasma electrolytic oxidation process to form a ceramic layer from a portion of the metal substrate, thereby providing the ceramic layer and an underlying metal portion of the metal substrate. The method further includes etching gap(s) in the underlying metal portion of the metal substrate to form metal elements separated by the gap(s), and backfilling the gap(s) with a non-conductive substance. As such, the metal elements, the non-conductive substance filling the gap(s), and the ceramic layer collectively form a structure whereby the ceramic layer at least partially conceals the metal elements and the gap(s).

14 Claims, 5 Drawing Sheets

Related U.S. Application Data filed on Apr. 1, 2016, provisional application No. 62/300,631, filed on Feb. 26, 2016, provisional application No. 62/249,130, filed on Oct. 30, 2015.

(51) Int. Cl.

| | | |
|---|---|---|
| *B32B 15/00* | (2006.01) | |
| *B32B 18/00* | (2006.01) | |
| *B32B 37/12* | (2006.01) | |
| *C25D 11/02* | (2006.01) | |
| *C25D 11/04* | (2006.01) | |
| *C25F 3/08* | (2006.01) | |
| *H01Q 1/12* | (2006.01) | |
| *H01Q 1/38* | (2006.01) | |
| *H05K 1/05* | (2006.01) | |
| *H05K 1/09* | (2006.01) | |
| *H05K 3/46* | (2006.01) | |
| *C25D 11/18* | (2006.01) | |

(52) U.S. Cl.
CPC .............. *B32B 37/12* (2013.01); *C25D 11/02* (2013.01); *C25D 11/022* (2013.01); *C25D 11/026* (2013.01); *C25D 11/04* (2013.01); *C25D 11/18* (2013.01); *C25F 3/08* (2013.01); *H01Q 1/12* (2013.01); *H01Q 1/38* (2013.01); *H05K 1/053* (2013.01); *H05K 1/09* (2013.01); *H05K 3/4602* (2013.01); *B32B 2255/24* (2013.01); *B32B 2307/202* (2013.01); *B32B 2307/206* (2013.01); *B32B 2311/18* (2013.01); *B32B 2315/02* (2013.01); *B32B 2457/00* (2013.01); *H05K 2203/0315* (2013.01)

(58) Field of Classification Search
CPC ....... B32B 7/12; B32B 15/00; B32B 2457/00; B32B 2307/202; B32B 2307/206; B32B 2311/18; B32B 2255/24; B32B 2315/02; H05K 1/053; H05K 1/09; H05K 3/4602; H05K 2203/0315; H01Q 1/12; H01Q 1/38; C25F 3/08

See application file for complete search history.

(56) References Cited

U.S. PATENT DOCUMENTS

| | | | |
|---|---|---|---|
| 7,078,613 | B2 | 7/2006 | Spivack et al. |
| 7,921,553 | B2 | 4/2011 | Wojack et al. |
| 8,656,579 | B2 | 2/2014 | Wojack et al. |
| 9,565,777 | B1 * | 2/2017 | Arvin ..................... H05K 1/16 |
| 2005/0032558 | A1 | 2/2005 | Chen |
| 2005/0101356 | A1 | 5/2005 | Hutchison |
| 2006/0001130 | A1 | 1/2006 | Islam et al. |
| 2007/0020926 | A1 | 1/2007 | Kalvesten et al. |
| 2010/0053002 | A1 | 3/2010 | Wojack et al. |
| 2012/0176278 | A1 | 7/2012 | Merz et al. |
| 2013/0222195 | A1 | 8/2013 | Hill et al. |
| 2013/0302103 | A1 | 11/2013 | Sona et al. |
| 2014/0106684 | A1 | 4/2014 | Burns et al. |
| 2014/0125528 | A1 | 5/2014 | Tsai et al. |
| 2014/0191910 | A1 | 7/2014 | Chung et al. |
| 2014/0320369 | A1 | 10/2014 | Azenui et al. |
| 2014/0361945 | A1 | 12/2014 | Misra et al. |
| 2015/0048979 | A1 | 2/2015 | Asrani et al. |
| 2015/0167193 | A1 | 6/2015 | Demers et al. |
| 2016/0049720 | A1 | 2/2016 | Hwang et al. |
| 2017/0125897 | A1 | 5/2017 | Rubin et al. |

FOREIGN PATENT DOCUMENTS

| | | | |
|---|---|---|---|
| TW | 201301564 A | 1/2013 | |
| WO | 2010011009 A1 | 1/2010 | |
| WO | 2016190737 A2 | 12/2016 | |
| WO | WO2016190737 | * 12/2016 | ............. C25D 11/02 |

OTHER PUBLICATIONS

MetalMembranes.com B.V., "Method to produce electrically isolated or insulated areas in a metal, and a product comprising such area", Priority document for application PCT/NL2016/050372, 8 pages.
International Search Report and Written Opinion in PCT/US16/59512 dated Mar. 17, 2017, 9 pages.
International Search Report and Written Opinion in PCT/US16/59516 dated Mar. 31, 2017, 11 pages.
Non-Final Office Action dated Apr. 21, 2017, for U.S. Appl. No. 15/336,686 of Rubin, A.E. et al. filed Oct. 27, 2016.
Restriction Requirement dated Mar. 9, 2017, for U.S. Appl. No. 15/336,701 of Evans, D. et al. filed Oct. 27, 2016.
Notice of Allowance dated Sep. 18, 2017 for U.S. Appl. No. 15/336,686 of Rubin, A. et al., filed Oct. 27, 2016.
Office Action dated Sep. 8, 2017 in Taiwan Patent Application No. 105135167, 11 pages.
Restriction Requirement dated Jan. 31, 2017 for U.S. Appl. No. 15/336,686 of Rubin, A. et al. filed Oct. 27, 2016.
U.S. Appl. No. 15/697,373 of Gagne-Keats, J.S. filed Sep. 6, 2017.
U.S. Appl. No. 15/700,056 of Rubin, A. et al., filed Sep. 8, 2017.
U.S. Appl. No. 15/700,060 of Rubin, A. et al., filed Sep. 8, 2017.
U.S. Appl. No. 15/700,064 of Rubin, A. et al., filed Sep. 8, 2017.
Office Action and Search Report dated Dec. 11, 2017 for Taiwan Patent Application No. 105135142 of Essential Products, Inc. filed on Oct. 28, 2016.

* cited by examiner

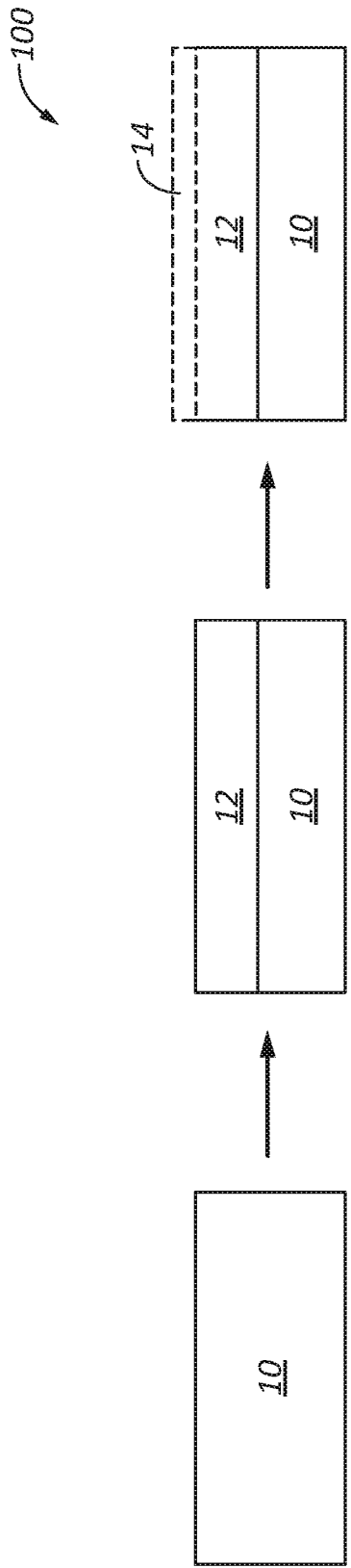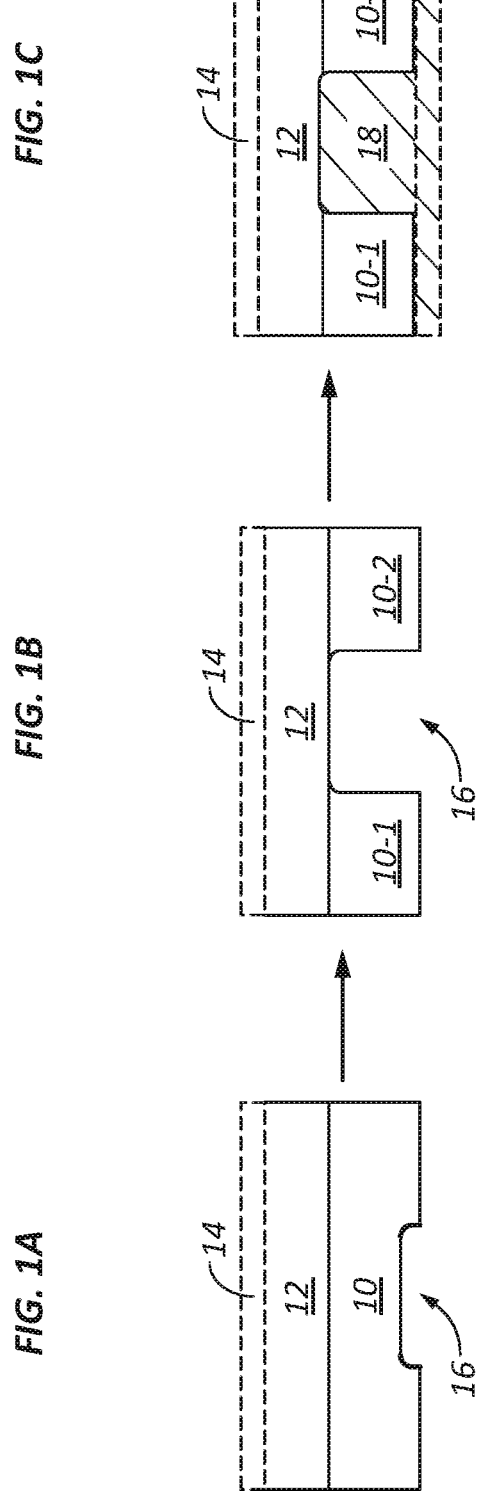

| Plate # | PEO | | | | | Epoxy | | ECM | | | |
|---|---|---|---|---|---|---|---|---|---|---|---|
| | $i$ [A] | $t$ [min] | $E_{max}$ [V] | $t_{tot}$ [min] | $\alpha$ [μm] | Epoxy | $\alpha$ + epoxy [μm] | $E$ [V] | $i_{t=0}$ [A] | Gap [mm] | Contact |
| (a) | 1÷20 | 10 | 350 | 10 | 0 | n.a. | n.a. | n.a. | n.a. | n.a. | n.a. |
| (b) | 20÷5 | 33 | 601 | 33 | 156.4 | EP02/EP14 | 160.3 | 46.1 | 10 | 2.0-2.5 | No |
| (c) | 20 | 11 | 601 | 60 | 67.2 | E-30CL | 147.8 | 46.1 | 10 | 2.0-2.5 | No |
| | 5 | 49 | 562 | | | | | | | | |
| (d) | 20 | 6 | 490 | 30 | 33.2 | E-30CL | 58.3 | 46.1 | 10 | 2.5-3.0 | Yes |
| | 10 | 6 | 583 | | | | | | | | |
| | 5 | 18 | 558 | | | | | | | | |
| (e) | 20 | 9 | Fluctuations | 60 | 81 | EP02/EP14 | 100.3 | 46.1 | 10 | 2.0-2.5 | No |
| | 10 | 11 | 584 | | | | | | | | |
| | 5 | 40 | 572 | | | | | | | | |
| (f) | 20 | 5 | 372 | 45 | 81.6 | E-30CL | 118.0 | 46.1 | 10 | 2.0-3.0 | No |
| | 10 | 8 | 587 | | | | | | | | |
| | 5 | 32 | 571 | | | | | | | | |
| (g) | 20 | 6 | Fluctuations | 40 | 78 | EP02/EP14 | 87.3 | 46.1 | 10 | 2.0-2.5 | Yes |
| | 10 | 9 | 587 | | | | | | | | |
| | 5 | 25 | 568 | | | | | | | | |

FIG. 4

METHODS OF MANUFACTURING STRUCTURES HAVING CONCEALED COMPONENTS

CROSS REFERENCE TO RELATED APPLICATIONS

This application claims priority to U.S. provisional patent application Ser. No. 62/336,513 filed May 13, 2016, U.S. provisional patent application Ser. No. 62/317,466 filed Apr. 1, 2016, U.S. provisional patent application Ser. No. 62/249,130 filed Oct. 30, 2015, and U.S. provisional patent application Ser. No. 62/300,631 filed Feb. 26, 2016, which are all incorporated herein in their entireties by this reference.

TECHNICAL FIELD

The disclosed teachings relate to methods of manufacturing structures having concealed components. More particularly, the disclosed teachings relate to methods of manufacturing a structure having electrically insulated conductive elements that are at least partially concealed by a layer of the structure.

BACKGROUND

The design and manufacturing of consumer electronic devices are faced with challenges as consumers continue to demand a greater number of features in devices having smaller form factors. For example, consumers expect devices such as smartphones and smartwatches to include numerous features without compromising the demand for small sizes or sleek appearances.

The need for antennas in handheld devices is one example. In particular, devices such as smartphones include relatively complex antennas. Modern antenna designs are limited by physical and functional constraints due to the small sizes of handheld devices and the functional restrictions imposed by carriers and regulatory agencies. Moreover, a handheld device typically must accommodate numerous antennas, such as a primary cellular antenna, a diversity cellular antenna, a global positioning system (GPS) antenna, a Wi-Fi antenna, a near field communication (NFC) antenna, and the like. Accordingly, current methods of manufacturing components for consumer electronic devices present several challenges due to numerous constraints.

SUMMARY

Introduced here is at least one method to integrate metal elements separated by gaps with a structure that conceals the metal elements and the gaps. The method includes treating a metal substrate to a plasma electrolytic oxidation process that forms a ceramic layer from a portion of the metal substrate, thereby providing a ceramic layer over an underlying metal portion of the metal substrate. The method further includes etching gap(s) in the underlying metal portion of the metal substrate to form metal elements separated by the gap(s), and backfilling the gap(s) with a non-conductive substance. As such, the metal elements, the non-conductive substance filling the gap(s), and the ceramic layer collectively form a structure whereby the ceramic layer at least partially conceals the metal elements and the gap(s).

Other aspects of the disclosed embodiments will be apparent from the accompanying figures and detailed description.

This Summary is provided to introduce a selection of concepts in a simplified form that are further described below in the Detailed Description. This Summary is not intended to identify key features or essential features of the embodied subject matter, nor is it intended to be used to limit the scope of the embodied subject matter.

BRIEF DESCRIPTION OF THE DRAWINGS

FIGS. 1A through 1F illustrate a manufacturing process for separating a metal plate into electrically insulated metal elements according to some embodiments of the present disclosure;

FIG. 4 is a table showing parameters involved in different processes for separating metal plates into electrically insulated metal elements according to some embodiments of the present disclosure.

DETAILED DESCRIPTION

Figure 2A:
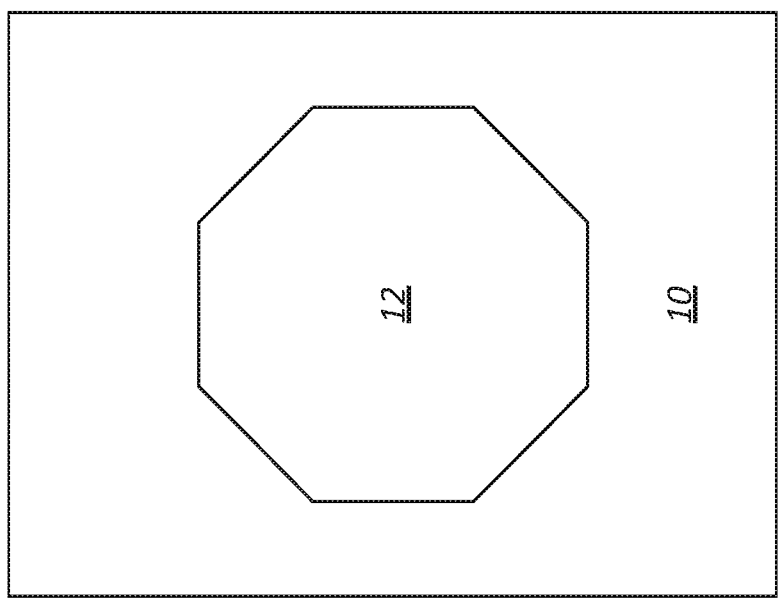
FIGS. 2A and 2B are top views of a structure illustrating a process for separating a metal plate into electrically insulated metal elements according to some embodiments of the present disclosure.

The embodiments set forth below represent the necessary information to enable those skilled in the art to practice the embodiments, and illustrate the best mode of practicing the embodiments. Upon reading the following description in light of the accompanying figures, those skilled in the art will understand the concepts of the disclosure and will recognize applications of these concepts that are not particularly addressed here. It should be understood that these concepts and applications fall within the scope of the disclosure and the accompanying claims.

The purpose of terminology used here is only for describing embodiments and is not intended to limit the scope of the disclosure. Where context permits, words using the singular or plural form may also include the plural or singular form, respectively.

As used herein, the term "integrated with" and variations thereof refer to structurally combining physical features with one another.

As used herein, the term "concealed" refers to something that is not readily visible by an unaided human eye.

As used herein, the term "handheld device" refers to a relatively small mobile computing device. Examples include a smartphone, tablet computer, wearable computer, or the like.

As used herein, the term "antenna element" refers to an electrically conductive element of an antenna that can radiate or receive electromagnetic radiation. For example, the conductive elements of a dipole antenna are antenna elements.

As used herein, the term "antenna break" refers to a gap or separation between antenna elements of an antenna. An antenna break is usually formed of non-conductive material that insulates antenna elements from each other.

As used herein, the term "communications circuitry" refers to the various electronic circuitry included in a handheld device that controls the operations of an antenna to, for example, provide radio frequency (RF) electromagnetic radiation.

As used herein, unless specifically stated otherwise, terms such as "processing," "computing," "calculating," "determining," "displaying," "generating" or the like, refer to actions and processes of a computer or similar electronic computing device that manipulates and transforms data represented as physical (electronic) quantities within the computer's memory or registers into other data similarly represented as physical quantities within the computer's memory, registers, or other such storage medium, transmission, or display devices.

As used herein, the terms "connected," "coupled," or variants thereof, refer to any connection or coupling, either direct or indirect, between two or more elements. The coupling or connection between the elements can be physical, logical, or a combination thereof.

The disclosed embodiments include methods of manufacturing a structure, including metal elements separated by a gap, including non-conductive material. As such, the metal elements are electrically insulated from each other. The structure has a continuous and uniform non-conductive surface that at least partially conceals the metal elements and the gap. In some embodiments, the metal elements can be electrically connected to circuitry to enable the structure to provide added functionality.

For example, the structure can be an encasing for a handheld device that includes a concealed antenna. In this embodiment, the metal elements separated by the gap that includes non-conductive material correspond to antenna elements separated by an antenna break. The antenna can be concealed by the continuous and uniform non-conductive exterior surface of the encasing. The exterior surface can be a layer of material that is transparent to RF electromagnetic radiation. As a result, an antenna can be integrated with an encasing of a handheld device for added functionality while providing a sleek appearance.

Specifically, according to the methods disclosed herein, a structure can be formed of multiple layers, including an exterior layer and an interior layer. An exterior layer may be composed of non-conductive material and form the continuous exterior surface of the structure. An interior layer may be composed of conductive material separated by non-conductive material, which is concealed by the external continuous layer of non-conductive material. This continuous exterior layer may be transparent to electromagnetic radiation emitted by the interior layer.

FIGS. 1A-1F illustrate a manufacturing process 100 for separating a metal plate into electrically insulated metal elements according to some embodiments of the present disclosure. In FIG. 1A, the manufacturing process 100 begins with a solid metal plate 10. Examples of a metal plate include a titanium (Ti) plate or any conductive plate.

In FIG. 1B, the manufacturing process 100 continues by subjecting the metal plate 10 to a plasma electrolytic oxidation (PEO) process. The PEO process causes a porous ceramic layer 12 to be formed on one side of the metal plate 10. In FIG. 1C, the ceramic layer 12 can optionally be reinforced with an epoxy layer 14. The remaining portion of the metal plate 10 then undergoes an etching process in FIGS. 1D and 1E to form a gap 16 on the other side of the metal plate 10.

Specifically, in FIG. 1D, the etching process may optionally include an initial Computer Numerical Control (CNC) mechanical machining process followed by an electrochemical machining (ECM) process, as shown in FIG. 1E. The CNC machining process may cause vibrations that could compromise the structural integrity of the ceramic layer 12. As such, the CNC machining process can be applied to initiate the etching process, which is completed with the ECM process. However, either the CNC machining process or the ECM process can be used alone to etch the gap 16.

The result of the etching process is two electrically insulated metal elements 10-1 and 10-2 supported by the ceramic layer 12, which can be reinforced by the epoxy layer 14. Lastly, in FIG. 1F, the gap 16 is filled with a non-conductive substance 18, such as a plastic, adhesive, or any non-conductive substance. In some embodiments, the non-conductive substance 18 could be coated on the surface of the etched metal plate 10. As detailed below, the electrically insulated metal elements 10-1 and 10-2 could be coupled to circuitry to form electrically insulated electronic components.

The disclosed embodiments for manufacturing structures that include concealed components are not limited to that shown in FIGS. 1A-1F. Instead, any combination of suitable materials with suitable properties could be arranged in any number of layers.

A PEO process is an electrochemical technique that allows for forming ceramic coatings on a variety of metals, such as aluminum, magnesium, and alloys, in addition to titanium. Specifically, a PEO process can include immersing a surface of a bulk metal substrate in a solution containing a suitable electrolyte. The metal surface is subjected to a high potential difference (e.g., up to 600 Volts) such that energetic discharge processes occur through a thin oxide layer between the solution and the immersed surface of the bulk metal substrate. The discharge processes (e.g., sparks) induce plasma, which modifies the chemical structure and porosity of the oxide layer, to generate thick and largely crystalline (i.e., ceramic) oxide layers for the metal plate 10.

In some embodiments, the ECM process is a machining method by which a metal or alloy is selectively dissolved by a process of electrolysis. Specifically, when applying an electric potential between a stainless steel cathode and a metal plate (hereby acting as the anode), the product will dissolve in locations where the distance between the cathode and product is smallest, forming an inverse shape of the cathode in the metal plate. A suitable electrolyte can be flushed between the cathode and the anode to conduct electric current and remove dissolved metal, as well as gas and heat generated during the ECM process.

Figure 2B:
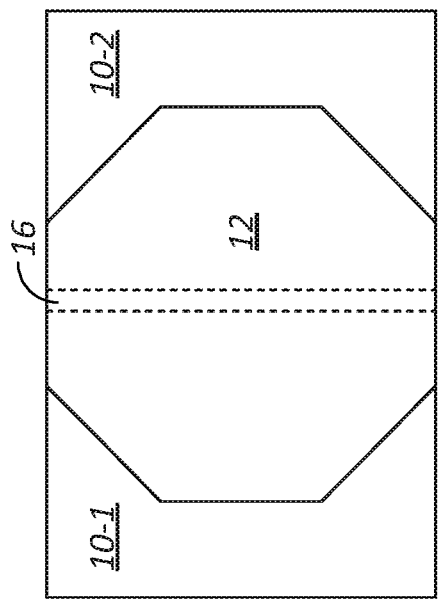

FIGS. 2A and 2B are top views of a structure illustrating a process 200 for separating a metal plate into electrically insulated metal elements according to some embodiments of the present disclosure. In FIG. 2A, the process 200 begins with a metal plate 10, such as a Ti-6Al-4V (Grade 5) plate. The metal plate 10 is subjected to a PEO process inside a PEO cell to form an oxidized surface (e.g., ceramic layer 12). The ceramic layer 12 formed of the metal plate 10 can have any desired shape and size. As shown, the ceramic layer 12 is octahedral-shaped and has a geometric area of 3.4 $cm^2$. Specifically, the metal plate 10 can be oxidized in a solution such as 8 g/L $Na_2SiO_3$ and 15 g/L $(NaPO_3)_6$ electrolyte at the flow rate of 3.4 L/min. The process 200 can be carried out using a DC square pulsed voltage (e.g., frequency at 1 kHz) and in a galvanostatic mode (i.e., at constant current density).

After the PEO treatment, the metal plate 10 can be cut, as shown in FIG. 2B. This allows for obtaining the two electrically insulated metal plates 10-1 and 10-2 connected by an electrically insulating ceramic layer 12. After cutting the metal plate 10, the ceramic layer 12 can be coated with the epoxy layer 14 (not shown in FIG. 2A or 2B). For example, a thin layer of two different transparent epoxies, such as EPO2:EP14=100:60 and E-30CL, can be coated on the ceramic layer 12. The former epoxy can harden in air at room temperature, while the latter epoxy can be kept in the oven for 12 hours at 60° C., and then at room temperature for 12 hours to harden.

The epoxy layer 14 (not shown in FIG. 2A or 2B) can provide extra mechanical stability to support the weight of the metal plate 10 during the etching process to produce the gap 16, which may not be possible with the ceramic layer 12 alone. Moreover, the epoxy layer 14 alone may not have the same strength of the epoxy layer 14 combined with the ceramic layer 12. After the hardening of the epoxy layer 14, the metal plate 10 can be placed in an etching cell and subjected to, for example, a square wave pulsed voltage for the ECM process. For example, the electrolyte can include a solution of 425 g/L-1 $NaNO_3$. In some embodiments, an ECM process can apply 46.1 Volts with a pulse width of 1 millisecond, a 4 millisecond pause between pulses, and 54,000 repetitions.

Figure 3:
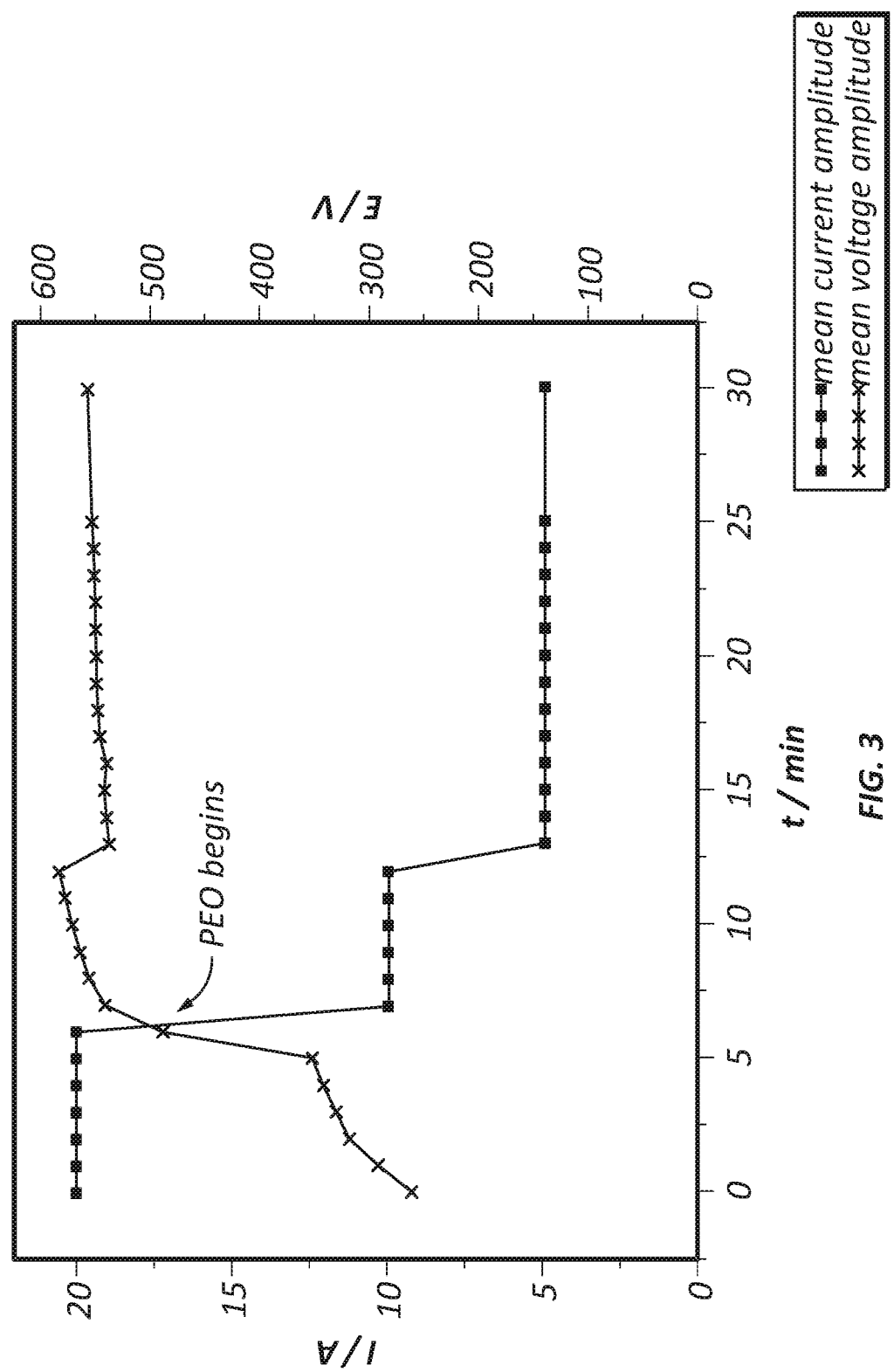
FIG. 3 is a graph showing variations of mean current and voltage amplitude values during a plasma electrolytic oxidation (PEO) treatment of a metal plate according to some embodiments of the present disclosure.

FIG. 3 is a graph showing variations of mean current and voltage amplitude values over time during a PEO treatment of a metal plate according to some embodiments of the present disclosure. Specifically, the values shown in FIG. 3 are applied to form a ceramic layer on a Ti-6Al-4V (Grade 5) plate. Hence, the PEO conditions could be adjusted in accordance with the values shown in FIG. 3 to obtain a desired ceramic layer for a Ti-6Al-4V (Grade 5) plate. In contrast, an anodized Ti layer (not a ceramic layer) could result in a Ti Grade 5 plate when applying conditions used to oxidize a Grade 1 or Grade 2 Ti plate.

A relatively high current (e.g., i=20 A) value is applied at the beginning of the process (t=0) illustrated by FIG. 3. The relatively high current value leads to an increase of potential. The PEO process begins when the voltage exceeds a sparking potential of the metal plate. The sparking potential corresponds to the voltage at which the discharge process begins (the inflection of the curve shown in FIG. 3). Then, the current can be progressively diminished without affecting the voltage much, which remains constant. As a result, this process could achieve the ceramic layer 12 of the metal plate 10.

FIG. 4 is a table showing parameters involved in different processes for separating metal plates into electrically insulated metal elements according to some embodiments of the present disclosure. Specifically, shown are parameter values for a PEO process, epoxy layer, and ECM process used to produce the respective structures (a) through (g). Each of (a) through (g) begins with a metal plate having a surface area of 3.36 $cm^2$ that is exposed to a PEO treatment. The parameter variables "E," "i," and "t" refer to a potential (or voltage), current, and time, respectively. The variable "$t_{tot}$" refers to the total time duration of the PEO process.

The thickness of a ceramic layer of a metal plate can vary by varying the PEO process. Hence, a ceramic layer can have a desired thickness while maintaining a continuous and uniform appearance. Specifically, the variable "a" represents the thickness of the ceramic layer for a respective structure. The thickness of a ceramic layer is defined as a thickness of the ceramic layer and the underlying metal plate minus thickness of the metal plate before undergoing the PEO treatment (about 502 micrometers thick). The variable "a" is a conservative estimate of thickness because it does not take into account that the PEO process consumes the metal plate to some extent. Thus, the ceramic layers that conceal the metal elements of (a) though (g) range from 33 to 156 micrometers while maintaining a continuous and uniform appearance.

After completing the PEO process, each structure (a) through (g) can be treated with combinations of two different epoxies to improve the mechanical resistance of each structure that undergoes an etching process. The variable "a+epoxy" represents the thickness of the ceramic layer "a" after the addition of an epoxy layer. As shown, the thickness of the ceramic layer combined with epoxy layer(s) that conceal the metal elements vary from 58.3 to 160.3 micrometers. As such, estimates of the thicknesses of the structures (a) through (g) before and after the application of the epoxies can be derived from the values shown in the table of FIG. 4. The epoxy layer can provide added mechanical strength to support the subsequent etching process.

Lastly, the structures (a) through (g) can be subjected to an ECM process according to parameters outlined in the table of FIG. 4. In some embodiments, precipitation of hydroxide debris on a cathode during the ECM process should be avoided to prevent an incomplete etching of the metal plate. The resulting structures can be intact and robust (e.g., without detectable differences between the performances of the two different epoxies).

The two metal elements of each resulting structure can be electrically insulated from each other. As shown, the variable "contact" refers to whether there is any resulting electrical contact between the two metal elements of a respective structure after the ECM process was completed. Thus, the combination of the PEO processes and an etching process described above can be used to manufacture structures for a variety of applications, in addition to the those shown in FIG. 1A through 1F, or 2A and 2B.

However, the resulting structures are not limited by the number of layers shown in FIG. 1A through 1F, or 2A and 2B. Instead, the structures can include more or fewer layers. For example, a removable stabilizing layer, such as a plastic tape, could be used instead of a fixed epoxy layer. The plastic tape could provide mechanical strength when separating a metal plate into distinct metal elements (separated by a gap), and then removed after the etching process is complete or after backfilling a gap with any suitable non-conductive material.

An example of a specific product that could be manufactured from the processes described above is an encasing of a handheld device that includes a concealed antenna. For example, the encasing may be formed of an exterior layer and an interior layer. The exterior layer could correspond to the ceramic layer 12 and/or the epoxy layer 14. The interior layer could include the metal elements 10-1 and 10-2 separated by the gap 16.

The metal elements 10-1 and 10-2 can be electrically coupled to the communications circuitry of a handheld device to form antenna elements separated by an antenna break. As such, the processes described above can be used to integrate concealed antenna elements separated by an antenna break into an enchasing of a handheld device.

Figure 5:
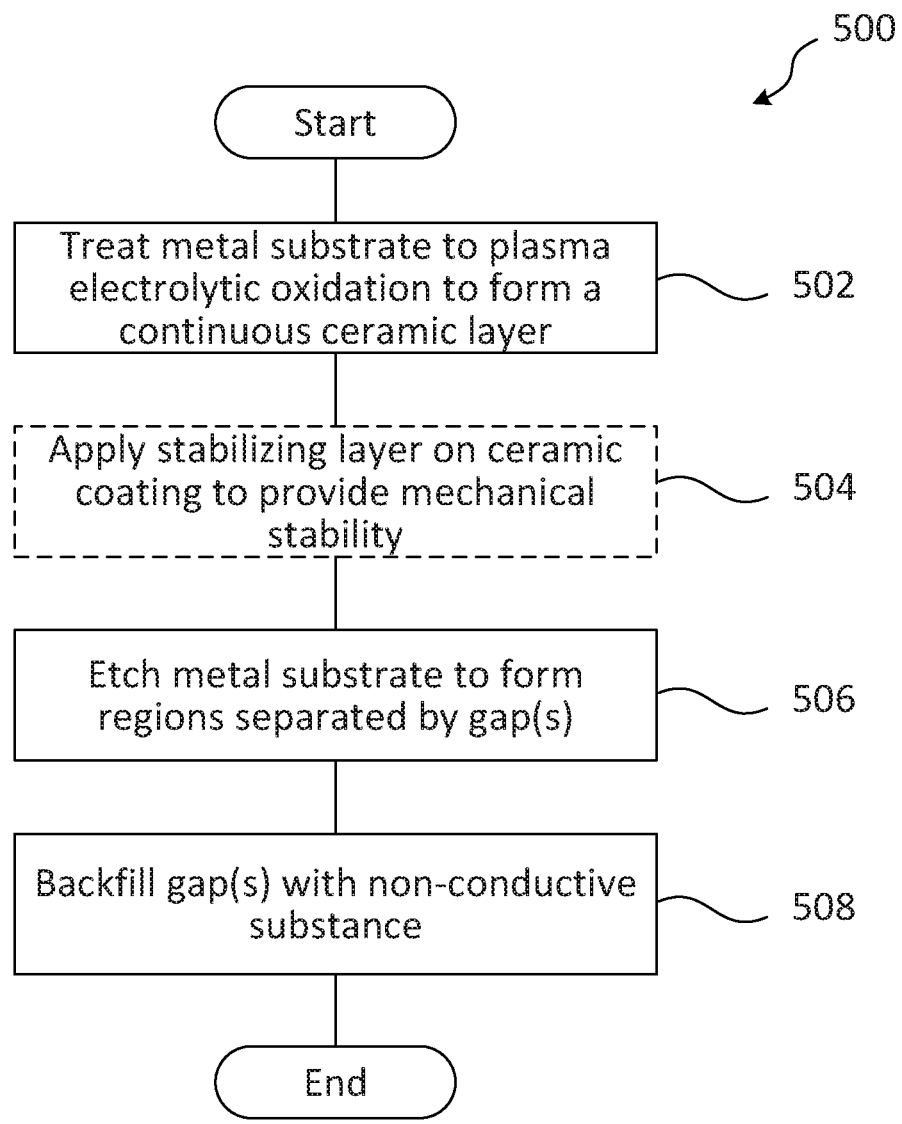
FIG. 5 illustrates a process for manufacturing an encasing of a handheld device that includes a concealed antenna according to some embodiments of the present disclosure.

FIG. 5 illustrates a process 500 for manufacturing an encasing structure of a handheld device that includes a concealed antenna according to some embodiments of the present disclosure. In step 502, a metal substrate (e.g., metal plate 10) is subjected to an electrochemical surface treatment process (e.g., PEO) to form a continuous and uniform non-conductive ceramic layer (e.g., ceramic layer 12) from the metal substrate.

In some embodiments, the ceramic layer 12 has sufficient mechanical strength alone to enable the etching and backfilling processes of the remaining metal substrate, to form antenna elements separated by one or more antenna breaks. For example, a ceramic layer could be 200 micrometers, which would support the etching and backfilling processes of a 300-micrometer thick underlying metal substrate.

In optional step 504, a stabilizing layer (e.g., epoxy layer 14) is applied on the ceramic layer to provide additional mechanical stability for the etching and backfilling processes of the metal substrate. In some embodiments, the stabilizing layer may be a plastic tape that can be removed after etching and backfilling.

In step 506, the remaining metal substrate undergoes one or more etching processes to form one or more gaps that separate the remaining metal substrate into regions supported by the ceramic and stabilizing layers. The etching processes may include an initial CNC machining process followed by an ECM process. As indicated above, the vibrations caused by CNC machining could compromise the integrity of the ceramic layer and, as such, an ECM process can be used to complete the etching process to mitigate this risk. In some embodiments, an ECM process may be used as the sole etching process to form the gap(s).

In step 508, the gap(s) are backfilled with a non-conductive filler that acts as an electrical insulator between the conductive metal regions. In some embodiments, the filler is a polymer and may include an adhesive that bonds the conductive metal regions and the ceramic coating. As a result, the combination of conductive metal regions separated by non-conductive filler, all supported by continuous non-conductive layers, can form a single encasing structure that integrates concealed antenna elements separated by antenna break(s).

The disclosed methods of integrating a concealed antenna with an encasing for a handheld device are not limited to the examples shown in FIG. 5. A person skilled in the relevant technologies would understand that the steps of the disclosed methods could be practiced in different orders. In some embodiments, the methods may omit certain steps or include steps known to persons skilled in the art but not described herein for the sake of brevity. For example, in some embodiments, non-conductive coating technology could be utilized to conceal antenna features.

While the disclosure has been described in terms of several embodiments, those skilled in the art will recognize that the disclosure is not limited to the embodiments described herein, and can be practiced with modifications and alterations within the spirit and scope of the invention. Those skilled in the art will also recognize improvements to the embodiments of the present disclosure. All such improvements are considered within the scope of the concepts disclosed herein and the embodiments that follow. Thus, the description is to be regarded as illustrative instead of limiting.

The invention claimed is:

1. A method of integrating metal elements separated by one or more gaps with a structure that conceals the metal elements and the one or more gaps, the method comprising:
   treating a metal substrate to a plasma electrolytic oxidation process to form a ceramic layer from a portion of the metal substrate, thereby providing the ceramic layer and an underlying metal portion of the metal substrate;
   etching one or more gaps in the underlying metal portion of the metal substrate to form a plurality of metal elements separated by the one or more gaps, wherein the etching comprises:
      etching the metal substrate by using a computer numerical control mechanical machining process to create one or more cavities on the metal substrate that are sufficiently deep to define one or more areas for etching the one or more gaps completely through the metal substrate and sufficiently shallow to avoid damaging the ceramic layer with vibrations from the computer numerical control mechanical machining process, and
      etching the metal substrate by using an electrochemical etching process to complete the one or more gaps through the metal substrate as defined by the cavities created by the computer numerical control mechanical machining process;
   backfilling the one or more gaps with a non-conductive substance such that the plurality of metal elements, the non-conductive substance filling the one or more gaps, and the ceramic layer collectively form a structure whereby the ceramic layer at least partially conceals the plurality of metal elements and the one or more gaps with the non-conductive substance; and
   coating all exposed surfaces of each of the plurality of metal elements with the non-conductive substance such that the plurality of metal elements are completely electrically isolated.

2. The method of claim 1, wherein, prior to etching the one or more gaps, the method further comprising:
   applying a stabilizing layer over the ceramic layer such that the stabilizing layer provides increased mechanical stability for the ceramic layer during the etching of the one or more gaps.

3. The method of claim 2, wherein the stabilizing layer comprises an epoxy.

4. The method of claim 2, wherein the stabilizing layer comprises a removable plastic tape, the method further comprising:
   removing the plastic tape after backfilling the one or more gaps.

5. The method of claim 1, wherein the metal substrate comprises any of titanium, aluminum, magnesium, or metal alloy.

6. The method of claim 1, wherein the ceramic layer comprises titanium oxide.

7. The method of claim 1, wherein the non-conductive substance is an adhesive that bonds the ceramic layer and plurality of metal elements.

8. A method of manufacturing a structure including concealed electrically conductive elements, the method comprising:
   forming a ceramic layer on an underlying conductive portion of a conductive substrate;
   etching the underlying conductive portion into a plurality of electrically insulated conductive regions such that the ceramic layer at least partially conceals the plurality of electrically insulated conductive regions, the etching comprising:
      subjecting the underlying conductive portion to an initial computer numerical control mechanical machining process to commence forming one or more gaps that separate the plurality of electrically insulated conductive regions, and
      subjecting the underlying conductive portion of the conductive substrate to an electrochemical etching process to complete the forming of the one or more gaps;
   backfilling the one or more gaps with a non-conductive substance such that the non-conductive substance bonds the ceramic layer and the plurality of electrically insulated conductive regions; and coating all exposed surfaces of each of the plurality of metal elements with the non-conductive substance such that the plurality of metal elements are completely electrically isolated.

9. The method of claim 8, wherein the ceramic layer is formed on an underlying conductive portion of a conductive substrate by treating a surface of the conductive substrate to a plasma electrolytic oxidation process.

10. The method of claim 8, wherein the ceramic layer at least partially conceals the one or more gaps.

11. The method of claim 8, wherein, prior to etching the underlying conductive portion, the method further comprises:
applying a stabilizing layer over the ceramic layer such that the stabilizing layer provides increased mechanical stability for the ceramic layer during the etching of the underlying conductive portion.

12. A method of integrating titanium elements separated by one or more gaps with a structure that conceals the titanium elements and the one or more gaps, the method comprising:
treating a titanium substrate to a plasma electrolytic oxidation process to form a titanium oxide layer and an underlying titanium layer;
etching one or more gaps in the underlying titanium layer to form a plurality of titanium elements separated by the one or more gaps, wherein the etching comprises:
mechanically etching an initial portion of each of the one or more gaps without damaging the titanium oxide layer, and
electrochemically etching a remaining portion of each of the one or more gaps though the plurality of titanium elements to the titanium oxide layer;
backfilling the one or more gaps with an insulating material, wherein the titanium oxide layer at least partially conceals the plurality of titanium elements and the one or more gaps backfilled with the insulating material; and
coating all exposed surfaces of each of the plurality of titanium elements with insulating material such that the plurality of titanium elements are completely electrically isolated.

13. The method of claim 12, wherein etching the one or more gaps comprises only electrochemically etching each of the one or more gaps.

14. The method of claim 12, wherein, prior to etching the one or more gaps, the method further comprising:
applying an epoxy layer over the titanium oxide layer such that the epoxy layer provides increased mechanical stability for the titanium oxide layer during the etching of the one or more gaps to form the plurality of titanium elements.

* * * * *